United States Patent
Kim et al.

(10) Patent No.: US 10,340,153 B2
(45) Date of Patent: Jul. 2, 2019

(54) FAN-OUT SEMICONDUCTOR PACKAGE AND METHOD OF MANUFACTURING SAME

(71) Applicant: SAMSUNG ELECTRO-MECHANICS CO., LTD., Suwon-si (KR)

(72) Inventors: Hong Won Kim, Suwon-si (KR); Tae Sung Jeong, Suwon-si (KR)

(73) Assignee: SAMSUNG ELECTRO-MECHANICS CO., LTD., Gyeonggi-do, Suwon-si (KR)

( * ) Notice: Subject to any disclaimer, the term of this patent is extended or adjusted under 35 U.S.C. 154(b) by 0 days.

(21) Appl. No.: 15/352,668

(22) Filed: Nov. 16, 2016

(65) Prior Publication Data

US 2017/0263573 A1 Sep. 14, 2017

(30) Foreign Application Priority Data

Mar. 14, 2016 (KR) .................. 10-2016-0030542

(51) Int. Cl.
*H01L 23/495* (2006.01)
*H01L 21/48* (2006.01)
(Continued)

(52) U.S. Cl.
CPC ........ *H01L 21/486* (2013.01); *H01L 21/4853* (2013.01); *H01L 21/4857* (2013.01);
(Continued)

(58) Field of Classification Search
CPC ............... H01L 23/562; H01L 23/3314; H01L 23/5383; H01L 23/5384; H01L 23/5386; H01L 21/4853; H01L 21/4857; H01L 21/485; H01L 21/565; H01L 23/49827; H01L 23/538–23/5389;
(Continued)

(56) References Cited

U.S. PATENT DOCUMENTS

| 6,239,482 B1 * | 5/2001 | Fillion | H01L 23/13 257/678 |
| 7,129,571 B2 * | 10/2006 | Kang | H01L 23/13 257/678 |

(Continued)

FOREIGN PATENT DOCUMENTS

| JP | 2014-056925 A | 3/2014 |
| KR | 10-2013-0067623 | 11/2014 |

OTHER PUBLICATIONS

Korean Office Action dated Dec. 14, 2018 issued in Korean Patent Application No. 10-2016-0030542 (with English translation).

*Primary Examiner* — Kevin M Picardat
(74) *Attorney, Agent, or Firm* — Morgan, Lewis & Bockius LLP

(57) ABSTRACT

A fan-out semiconductor package includes a redistribution layer, an interconnection member, a semiconductor chip, and a protective layer. The interconnection member has a through hole disposed on the redistribution layer. The semiconductor chip is disposed on the redistribution layer exposed within the through hole. The protective layer is formed between the redistribution layer and the interconnection member, and coupled to the interconnection member to protect the interconnection member.

15 Claims, 10 Drawing Sheets

(51) Int. Cl.
*H01L 23/538* (2006.01)
*H01L 23/31* (2006.01)
*H01L 23/00* (2006.01)
*H01L 21/56* (2006.01)

(52) U.S. Cl.
CPC ...... *H01L 23/3128* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 21/568* (2013.01); *H01L 2224/0401* (2013.01); *H01L 2224/04105* (2013.01); *H01L 2224/12105* (2013.01); *H01L 2224/131* (2013.01); *H01L 2224/96* (2013.01); *H01L 2225/1035* (2013.01); *H01L 2225/1041* (2013.01); *H01L 2924/10252* (2013.01); *H01L 2924/10253* (2013.01); *H01L 2924/14* (2013.01); *H01L 2924/18162* (2013.01); *H01L 2924/3511* (2013.01)

(58) Field of Classification Search
CPC ........................ H01L 21/4846–21/4867; H01L 23/498–23/49894; H01L 23/043; H01L 23/045; H01L 23/3114; H01L 23/3128; H01L 23/3735; H01L 2225/1047; H01L 2225/06548

USPC .......................................................... 257/668
See application file for complete search history.

(56) References Cited

U.S. PATENT DOCUMENTS

| | | | |
|---|---|---|---|
| 7,528,482 B2 | 5/2009 | Huang et al. | |
| 7,545,047 B2* | 6/2009 | Bauer | H01L 21/6835 257/686 |
| 7,786,591 B2* | 8/2010 | Khan | H01L 23/13 257/668 |
| 8,498,131 B2* | 7/2013 | Fillion | H01L 23/13 257/680 |
| 8,941,230 B2* | 1/2015 | Kyozuka | H01L 24/19 174/256 |
| 9,269,691 B2* | 2/2016 | Chi | H01L 24/24 |
| 9,349,611 B2* | 5/2016 | Chen | H01L 21/50 |
| 9,406,658 B2* | 8/2016 | Lee | H01L 25/16 |
| 9,622,354 B2* | 4/2017 | Tuominen | H01L 24/24 |
| 2006/0186531 A1* | 8/2006 | Hsu | H01L 23/13 257/700 |
| 2008/0150164 A1* | 6/2008 | Chia | H01L 23/49833 257/783 |
| 2014/0070396 A1 | 3/2014 | Kyozuka et al. | |
| 2015/0061142 A1* | 3/2015 | Hsu | H01L 25/105 257/773 |
| 2016/0043047 A1* | 2/2016 | Shim | H01L 21/561 257/773 |

* cited by examiner

FAN-OUT SEMICONDUCTOR PACKAGE AND METHOD OF MANUFACTURING SAME

CROSS-REFERENCE TO RELATED APPLICATION(S)

This application claims the benefit under 35 USC 119(a) of Korean Patent Application No. 10-2016-0030542, filed on Mar. 14, 2016, in the Korean Intellectual Property Office, the entire disclosure of which is incorporated herein by reference for all purposes.

BACKGROUND

Field

The following description relates to a fan-out semiconductor package and a method of manufacturing the same.

Description of Related Art

A fan-out semiconductor package is defined as package technology electrically connecting component semiconductor chip to a printed circuit board (PCB) such as a main board of an electronic device, or the like, and protecting the electronic component from external impacts. Meanwhile, a significant recent trend in the development of technology related to a semiconductor chip is to reduce the size of the semiconductor chip. Hence, in accordance with a rapid increase in demand for compact electronic components, or the like, the implementation of a fan-out semiconductor package having a compact size and including a plurality of pins has been demanded.

One type of package technology suggested to satisfy the technical demand as described above is a wafer level package (WLP) using a redistribution wiring of an electrode pad included in a semiconductor chip formed on a wafer. Wafer level packages include a fan-in WLP and a fan-out WLP. The fan-out WLP has a reduced size, and is advantageous in terms of implementing a plurality of pins. Therefore, the fan-out WLP has been actively developed.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In one general configuration, a fan-out semiconductor package includes a redistribution layer, an interconnection member, a semiconductor chip, and a protective layer. The interconnection member has a through hole disposed on the redistribution layer. The semiconductor chip is disposed on the redistribution layer exposed within the through hole. The protective layer is formed between the redistribution layer and the interconnection member, and coupled to the interconnection member to protect the interconnection member.

The protective layer may include a metallic material.

The protective layer may be electrically insulated from the semiconductor chip.

The protective layer may be attached to a lower surface of the interconnection member, and may have a shape corresponding to a shape of the lower surface of the interconnection member.

The protective layer may be only formed on the lower surface of the interconnection member.

The protective layer may be attached to a lower surface of the interconnection member, and has a width narrower than a width of the interconnection member.

The semiconductor chip may include an electrode pad facing the redistribution layer, and the electrode pad and the protective layer are positioned on the same level.

The protective layer may include a hole formed therein to pass through the protective layer in a thickness direction of the protective layer.

The hole may be provided with a plurality of holes, and the plurality of holes are uniformly arranged.

The interconnection member includes a conductive via passing through the interconnection member to be electrically connected to the redistribution layer.

The protective layer includes a metallic material electrically insulated from the protective layer.

The protective layer includes a metallic material, and the conductive via included in the interconnection member may contact the protective layer.

The protective layer may be divided into a plurality of regions.

The redistribution layer may include an insulating layer, a conductive pattern formed on the insulating layer, and a conductive via passing through the insulating layer to be connected to the conductive pattern.

The fan-out semiconductor package may further include an encapsulant filling at least a portion of the through hole to encapsulate the semiconductor chip.

The encapsulant may include a conductive via passing through the encapsulant to be electrically connected to the redistribution layer.

In another general aspect, a fan-out semiconductor package includes an upper layer comprising an encapsulant, an interconnection member disposed on a protective layer, and a semiconductor chip disposed within the interconnection member. The encapsulant partially surrounds the interconnection member, the semiconductor chip, and the protective layer. A lower layer includes connection terminals. A middle layer defining a redistribution layer is disposed contiguously between the upper layer and the lower layer.

A conductive via may be formed through the encapsulant and the interconnection member to electrically connect an upper surface of the encapsulant to the middle layer.

A conductive pattern may be formed on the conductive via.

The fan-out semiconductor package may be a fan-out wafer level package (WLP).

An electronic device may include the fan-out semiconductor package.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
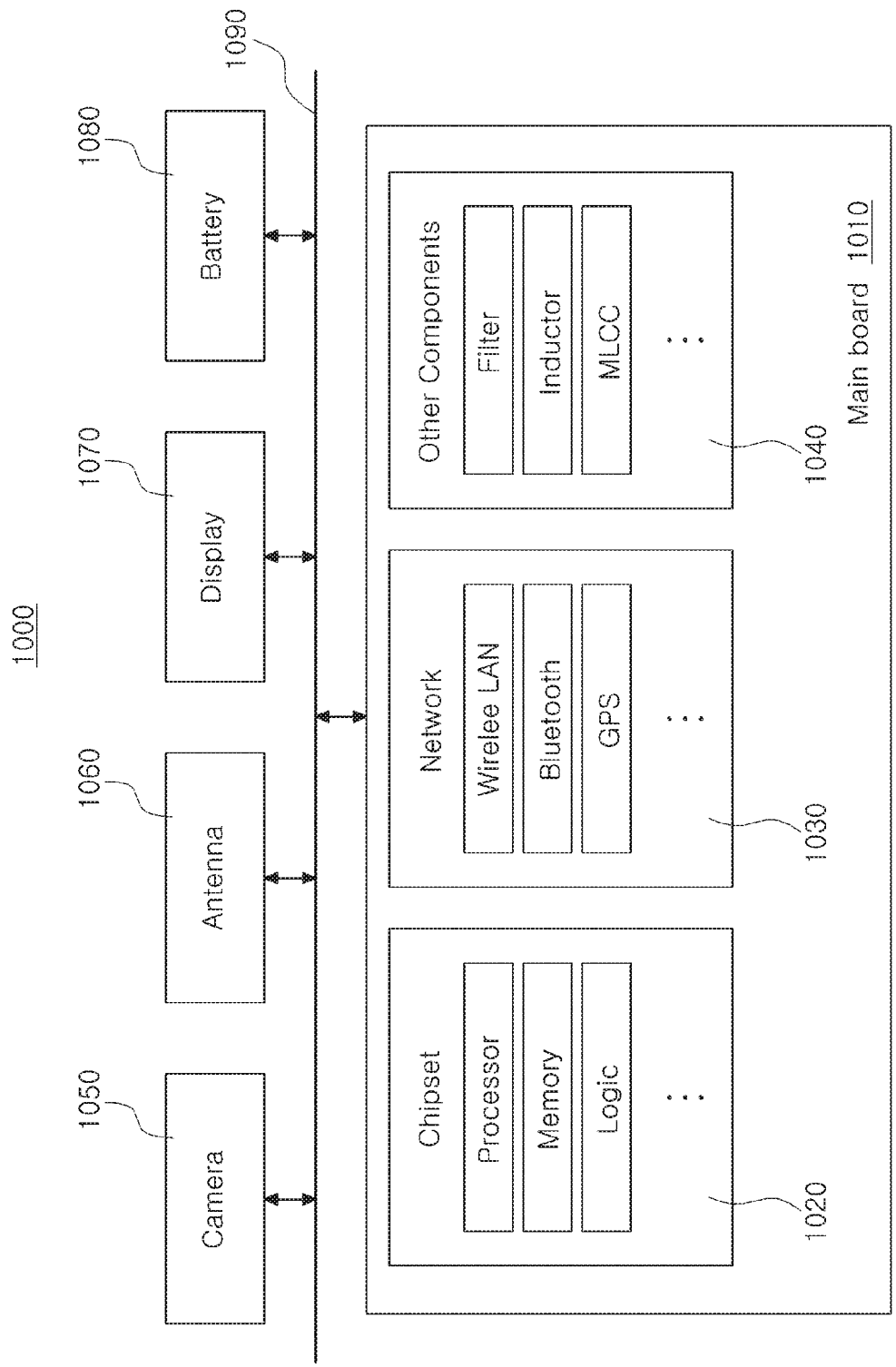
FIG. 1 is a schematic block diagram illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent to one of ordinary skill in the art. Further, although the examples described herein have a variety of configurations, other configurations are possible as will be apparent to one of ordinary skill in the art.

Electronic Device

FIG. 1 is a schematic block diagram illustrating an example of an electronic device system.

Referring to FIG. 1, an electronic device 1000 may accommodate a mother board 1010. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on the type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
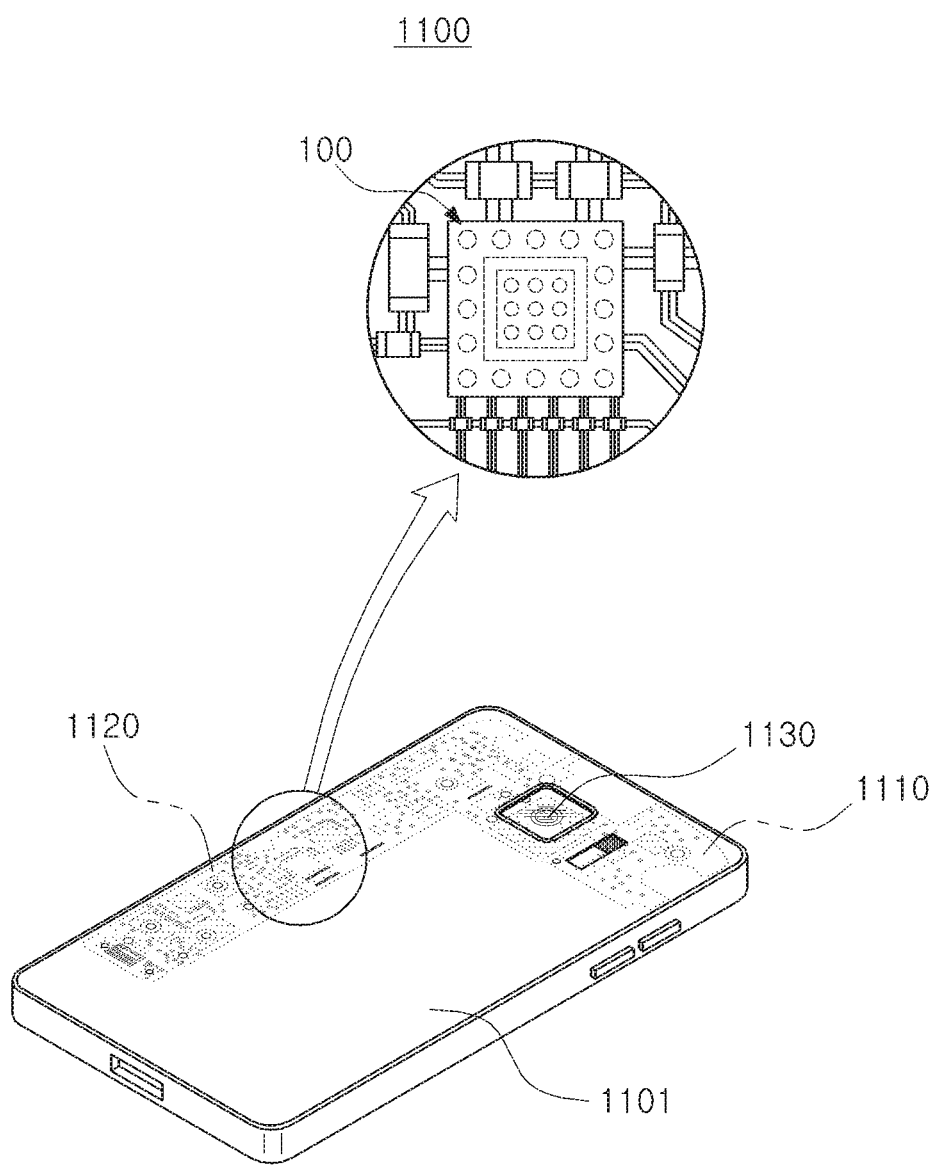
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated into a semiconductor chip. However, the semiconductor chip may not serve as a finished semiconductor product in itself, and may be damaged due to external physical or chemical impacts. Therefore, the semiconductor chip itself is not used, but is packaged and is used in an electronic device, or the like, in a packaged state.

Here, semiconductor packaging is required due to the existence of a difference in a circuit width between the semiconductor chip and a main board of the electronic device in terms of electrical connections. In detail, connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured by the packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

(Fan-In Semiconductor Package)

Figure 3B:
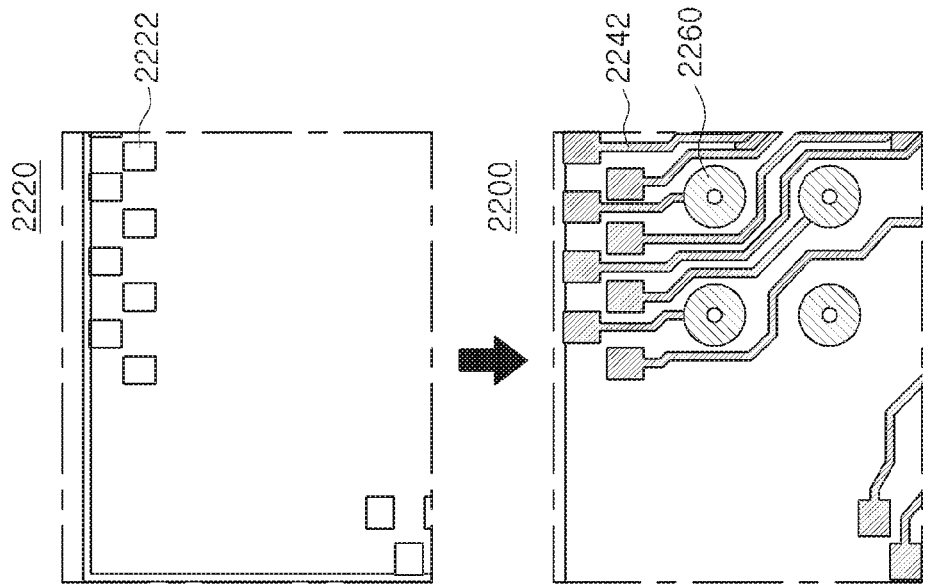
FIGS. 3A and 3B are schematic cross-sectional views illustrating states of a fan-in semiconductor package before and after being packaged.
Figure 3A:
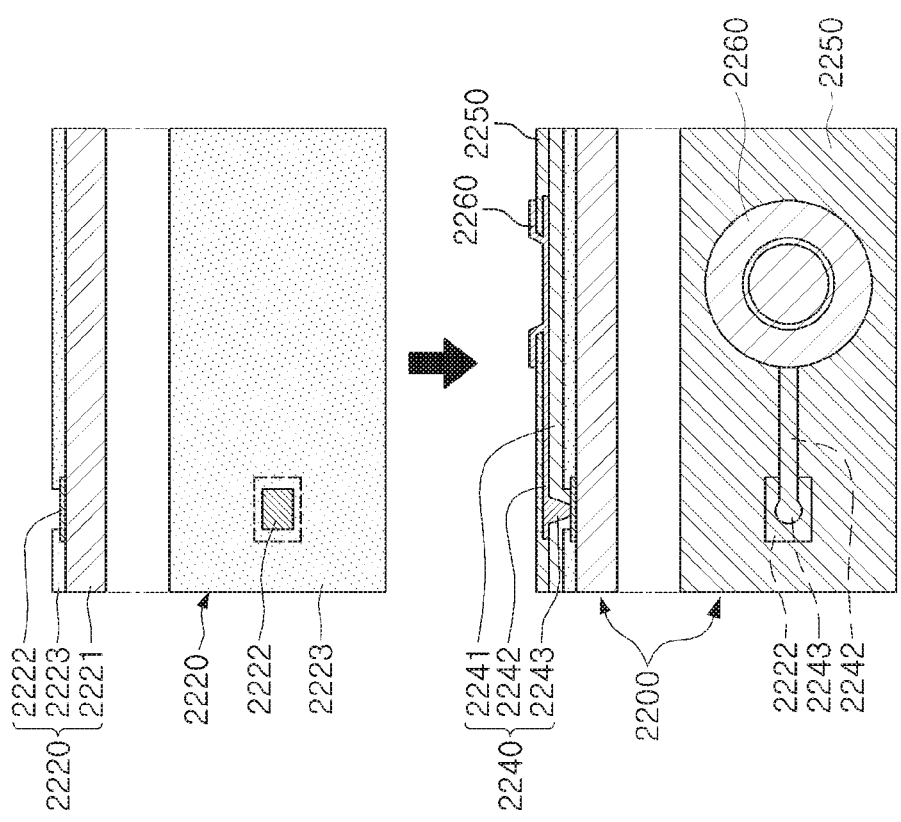

FIGS. 3A and 3B are schematic cross-sectional views illustrating states of a fan-in semiconductor package before and after being packaged.

Figure 4:
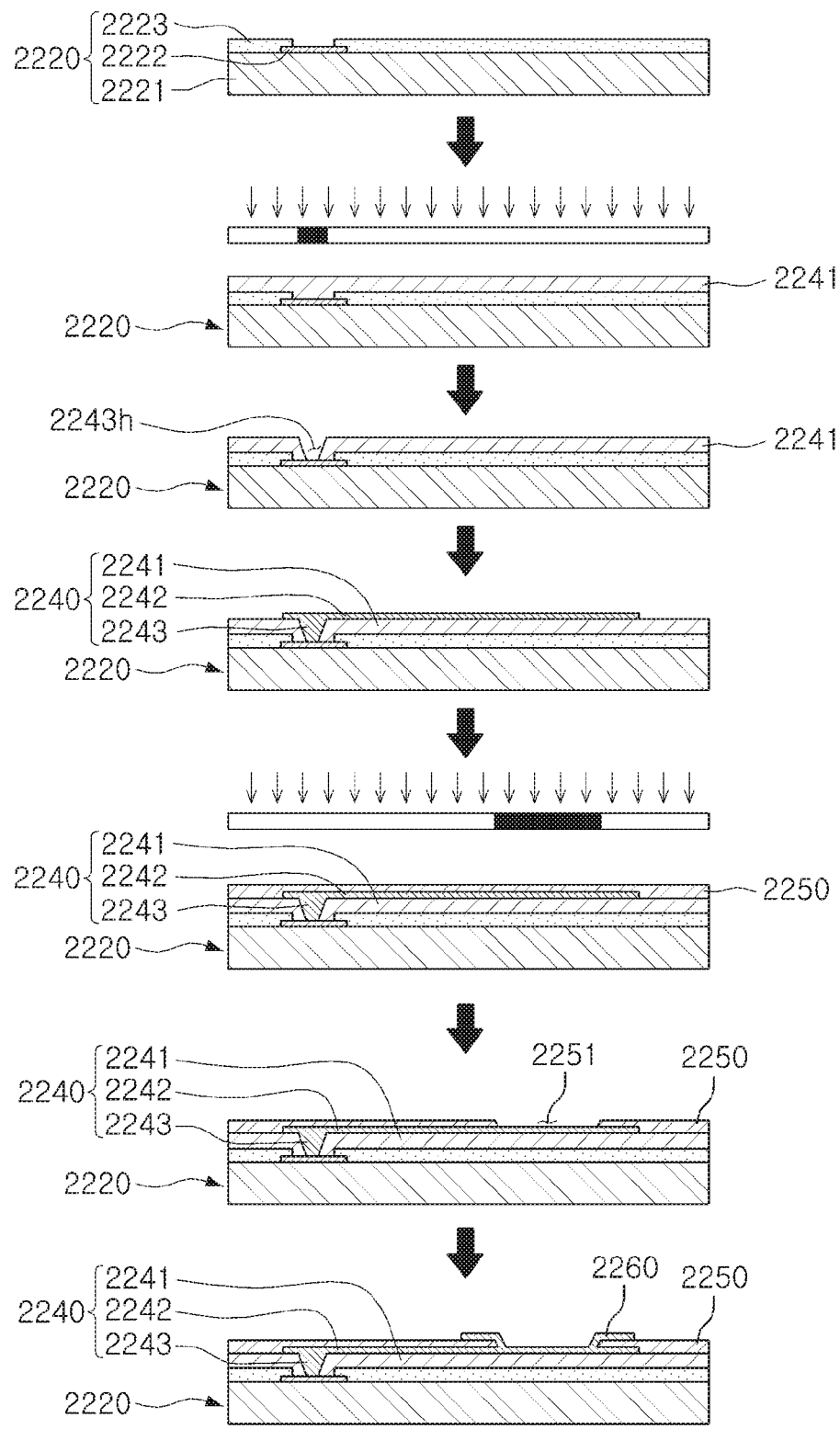
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in a smartphone have been manufactured in fan-in semiconductor package form. In detail, many elements mounted in the smartphone have been developed to implement a rapid signal transfer while having a compact size.

However, since all of the I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
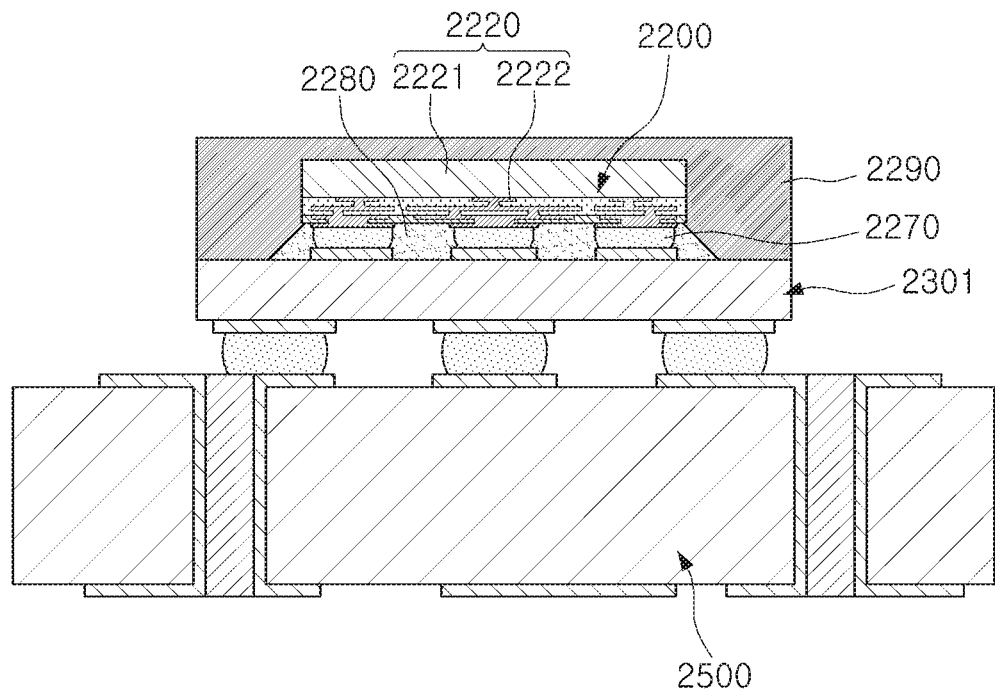
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
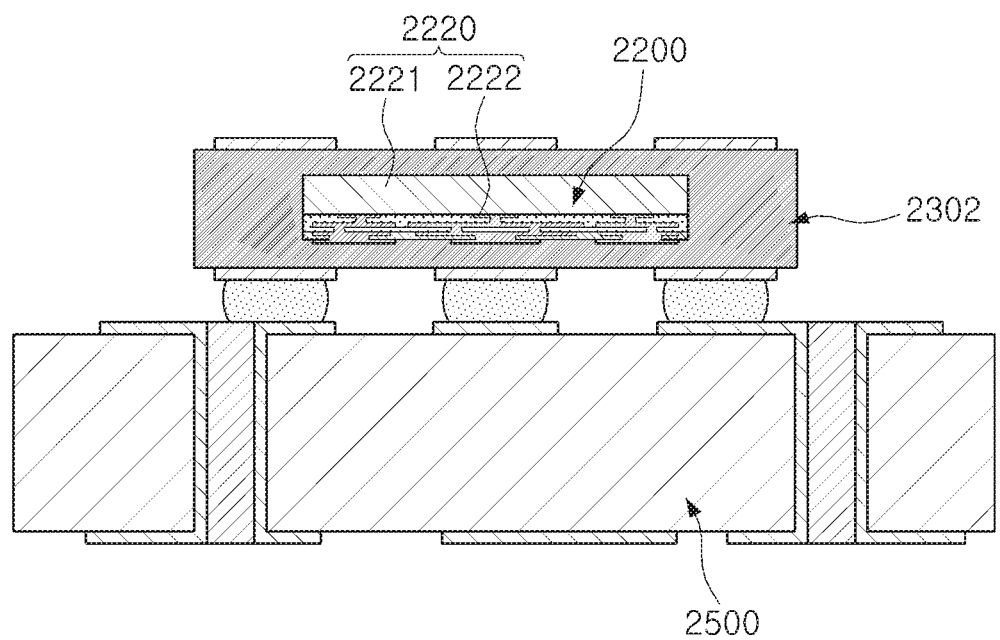
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. Here, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

(Fan-Out Semiconductor Package)

Figure 7:
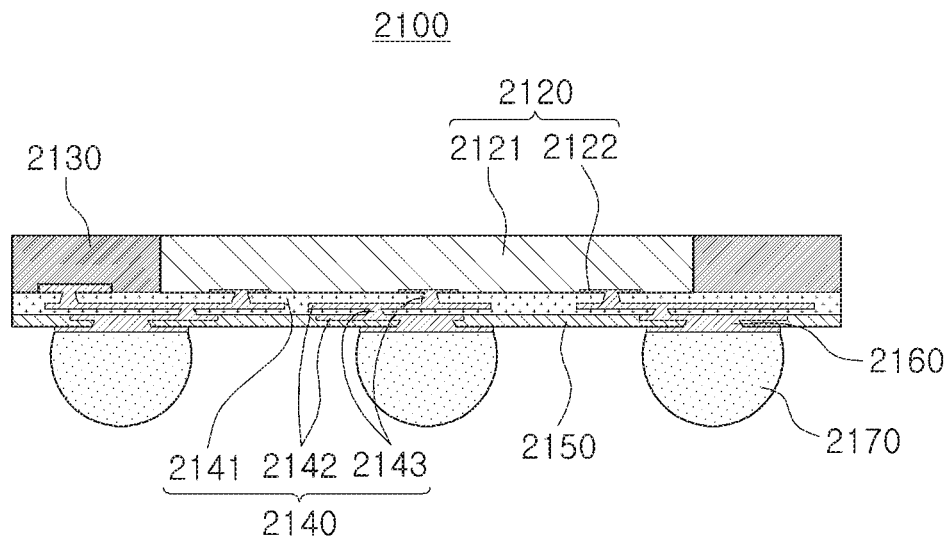
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed up to the outer side of the semiconductor chip 2120 by a connection member 2140. Here, a passivation layer 2150 may be further formed on the connection member 2140, and underbump metal layers 2160 may be further formed in openings of the passivation layer 2150. Solder balls 2170 may be further formed on the underbump metal layers 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed up outwardly of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed up to the outer side of the semiconductor chip through the connection member formed on the semiconductor chip as described above. Therefore, even though a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
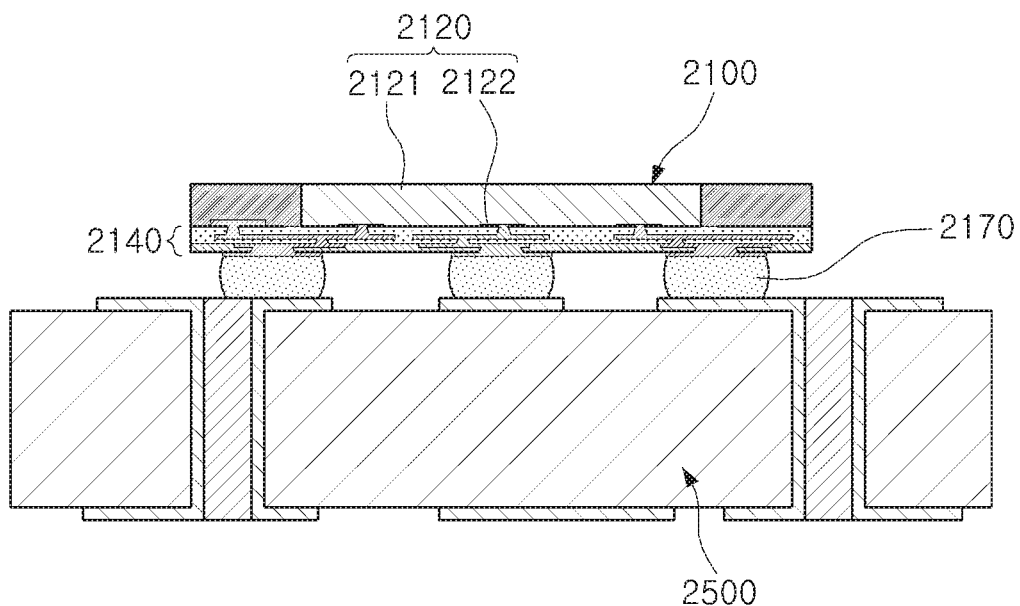
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to a package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
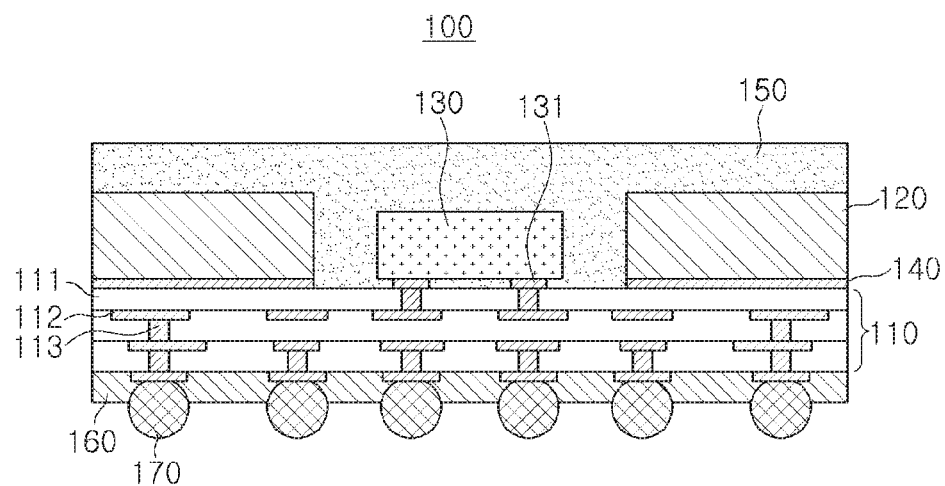
FIG. 9 is a schematic cross-sectional view illustrating an example of a fan-out semiconductor package.
Figure 10:
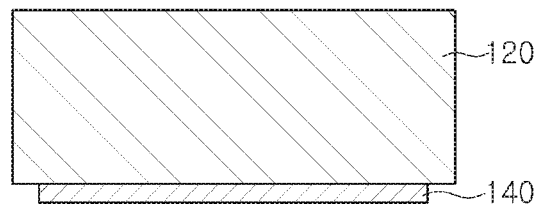
FIG. 10 is a cross-sectional view of a protective layer employable in a modification of the fan-out semiconductor package illustrated in FIG. 9.
Figure 11:
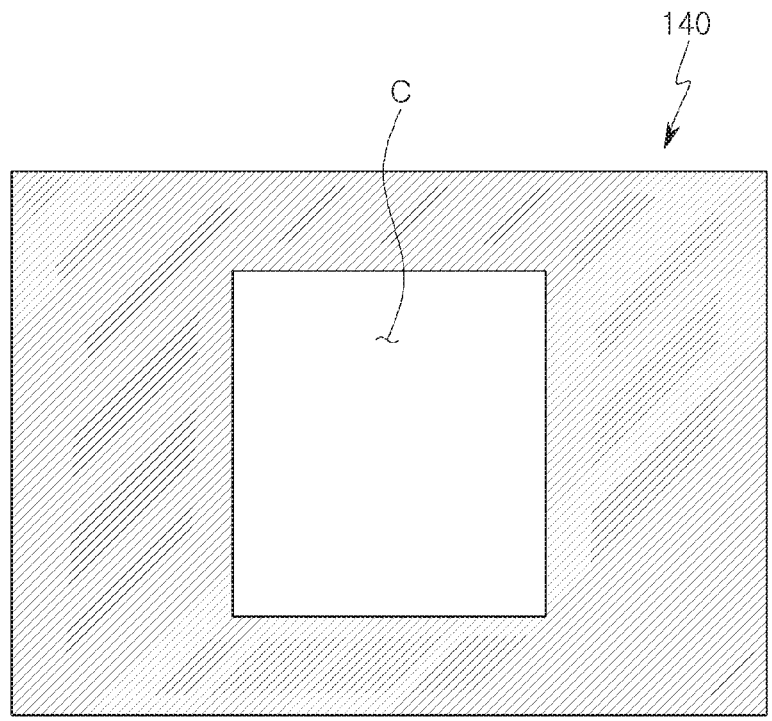
FIG. 11 is a schematic plan view illustrating a protective layer employed in the embodiment of FIG. 9.
Figure 12:
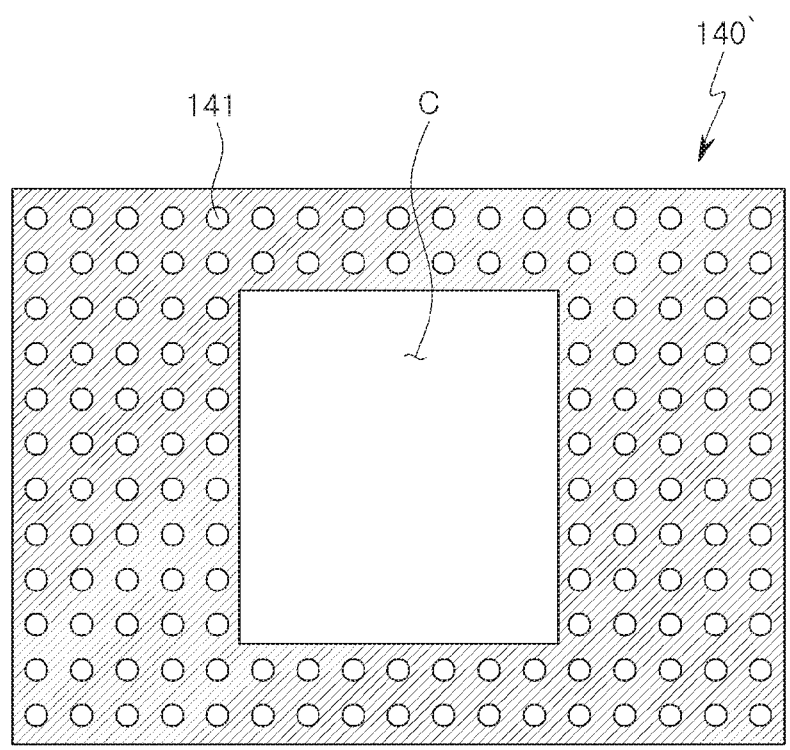
FIG. 12 is a plan view of a protective layer employable in a modification of the fan-out semiconductor package illustrated in FIG. 9.

FIG. 9 is a schematic cross-sectional view illustrating an example of a fan-out semiconductor package. FIG. 10 is a cross-sectional view of a protective layer employable in a modification of the fan-out semiconductor package illustrated in FIG. 9. FIG. 11 is a schematic plan view illustrating a protective layer employed in the embodiment of FIG. 9. FIG. 12 is a plan view of a protective layer employable in a modification of the fan-out semiconductor package illustrated in FIG. 9.

According to the embodiment of FIG. 9 in the present disclosure, the fan-out semiconductor package 100 includes a redistribution layer 110, an interconnection member 120, an electronic component 130, a protective layer 140, or the like. The respective components will hereinafter be described.

The redistribution layer 110 provides a disposition region for the electronic component 130, and includes an insulating layer 111, a conductive pattern 112, and a conductive via 113. Although not illustrated, the redistribution layer 110 is connected to an additional electronic component such as a memory, a passive device, or the like. In this case, if necessary, larger numbers of insulating layers 111, conductive patterns 112, and conductive vias 113 than those of the insulating layer 111, the conductive pattern 112, the conductive via 113 illustrated in FIG. 9 are provided in the redistribution layer 110.

The insulating layer 111 may include a thermosetting resin such as an epoxy resin, a thermoplastic resin such as a polyimide or a resin, impregnated with a stiffener such as a glass fiber or an inorganic filler, such as a pre-preg (PPG), an Ajinomoto build-up film (ABF), a FR-4 resin, a bismaleimide triazine (BT) resin, or the like. In addition, when a photo imagable dielectric (PID) material is used as an insulating material, the insulating layer 111 is be thinned, and a fine pattern is implemented more easily. In the redistribution layer 110, the insulating layers 111 forming each layer may include same or different materials. Also, a thickness of the insulating layer 111 is not particularly limited. A thickness of each layer except for the conductive pattern 112 may be, for example, about 5 µm to about 20 µm, and considering that of the conductive pattern 112, may be about 15 µm to about 70 µm.

The conductive pattern 112 serves as a wiring pattern or a pad pattern. The material of the conductive pattern 112 is an electrically conductive material such as copper (Cu), aluminum (Al), silver (Ag), tin (Sn), gold (Au), nickel (Ni), lead (Pb), or alloys thereof. The conductive pattern 112 performs various functions depending on designs of its corresponding layer. For example, the conductive pattern 112, a redistribution pattern, serves as a ground (GND) pattern, a power (PWR) pattern, a signal (S) pattern, or the like. Here, the S pattern may include various signals except for a GND pattern, a PWR pattern, or the like, and may include, for example, a data signal, or the like. In addition, the conductive pattern 112, a pad pattern, serves as a via pad, an external connection terminal pad, or the like. The thickness of the conductive pattern 112 is not particularly limited, and may be, for example, about 10 µm to about 50 µm.

The conductive via 113 electrically connects conductive patterns 112, formed in different layers, to each other, resulting in forming an electrical path within the fan-out semiconductor package 100. The material of the conductive via 113 is also a conductive material such as copper (Cu), aluminum (Al), silver (Ag), tin (Sn), gold (Au), nickel (Ni), lead (Pb), or alloys thereof. The conductive via 113 is also be filled with the conductive material, or the conductive material is also formed along a wall of the conductive via 113. In addition, a shape of the conductive via 113 may include all shapes known in the art and including a tapered shape in which a diameter of the conductive via 113 is decreased toward a lower surface thereof, a reverse tapered shape in which the diameter is increased toward the lower surface, a cylindrical shape, and the like.

The interconnection member 120 is disposed on the redistribution layer 110, and may be support the fan-out semiconductor package 100 or maintain rigidity thereof. For example, the interconnection member 120 may be a frame. The interconnection member 120 has a through hole (a region indicated by C in FIG. 11) for disposing the electronic component 130, and the through hole (C) is formed by inner walls surrounding the electronic component 130.

The material forming the interconnection member 120, although not particularly limited, is a molding resin or a PPG that is metal-based material or ceramic-based material. In this case, to reduce warpage of the fan-out semiconductor package 100, the interconnection member 120 is formed using a material having a relatively high Young's modulus, and may have, for example, a degree of rigidity higher than that of an encapsulant 150.

The electronic component 130 is disposed in a through hole of the redistribution layer 110, and can be various types of active components (for example, a diode, a vacuum tube, a transistor, and the like), or various types of passive components (for example, an inductor, a condenser, a resistor, and the like). The electronic component 130 is also an integrated circuit (IC) that may have several hundreds to several millions of elements or more integrated in a single chip. In other words, the electronic component 130 may be a semiconductor chip. If necessary, the electronic component 130 is also an electronic component in which an IC is packaged in a flip chip form. The IC chip may be, for example, an application processor chip such as a central processor (for example, a CPU), a graphic processor (for example, a GPU), a digital signal processor, a cryptographic processor, a microprocessor, a microcontroller, or the like, but is not limited thereto. In this case, FIG. 9 illustrates a case in which a single electronic component 130 is mounted on the redistribution layer 110, but two or more electronic components are also used.

In addition, as illustrated in FIG. 9, the electronic component 130 includes an electrode pad 131 formed on a surface of the electronic component 130, for example, an active surface. The electrode pad 131 faces the redistribution layer 110 to be electrically connected to the redistribution layer 110.

The protective layer 140 is formed in a space between the redistribution layer 110 and the interconnection member 120, and is coupled to the interconnection member 120 to protect the interconnection member 120. In more detail, the protective layer 140 protects the interconnection member 120 during the process of manufacturing the fan-out semiconductor package 100. As described below, the protective layer 140 prevents surface damage that may occur on the interconnection member 120 when separating the support from the interconnection member 120. When damage to the surface of frame 120 occurs, such as a scratch, it may negatively affect characteristics of the redistribution layer 110. Thus, according to the embodiment of FIG. 9, the protective layer 140 is separately formed on a lower surface of the interconnection member 120, thus increasing yield, structural stability, reliability, or the like, of the fan-out semiconductor package 100. In this case, according to the embodiment of FIG. 9, the protective layer 140 is formed in a space between the interconnection member 120 and the redistribution layer 110, for example, on the lower surface of the interconnection member 120. In some cases, an area in which the protective layer 140 is formed or disposed is more or less than the surface area of the interconnection member.

As one method of achieving such a purpose, the protective layer 140 is formed of a metallic material, and for example, a thin copper (Cu) film is attached to a surface of the interconnection member 120 to obtain the protective layer 140. The material of the protective layer 140, and method of forming the same may be changed without departing from the scope of the invention. In this case, in one example for performing an adequate protective function, as illustrated in FIGS. 9 and 11, the protective layer 140 is attached to the lower surface of the interconnection member 120, and has a shape corresponding to that of the interconnection member 120. Accordingly, according to the embodiment of FIG. 9, the through hole C is also formed in the protective layer 140 as illustrated in FIG. 11. In this case, as illustrated in a modification of FIG. 10, the protective layer 140 has a width narrower than that of the interconnection member 120, and such the shape of the protective layer 140 aids in handling the protective layer 140 and the interconnection member 120 during the manufacture of the fan-out semiconductor package 100.

As described above, a purpose of the protective layer 140 is to protect the interconnection member 120, or the like. Accordingly, even when the protective layer 140 includes a metallic material, the protective layer 140 does not serve as a wiring (conductor). For example, the protective layer 140 is electrically insulated from the electronic component 130, or the like. As described below, the protective layer 140 is also electrically connected to the electronic component 130, if necessary. In this case, the shape of the protective layer 140, the redistribution layer 110, or the like, is changed.

As illustrated in FIG. 9, the protective layer 140 and the electrode pad 131 of the electronic component 130 are positioned on the same planar surface. Such a structure significantly reduces variations in thicknesses of regions such as the interconnection member 120, the through hole C, the electronic component 130, and the like, and further prevents the encapsulant 150 from leaking.

Meanwhile, the protective layer 140 may include a hole provided as a gas discharge path, or the like, in a following process such as a plating process. For example, as illustrated in a modification of FIG. 12, a protective layer 140' includes a hole 141 formed therein to pass through the protective layer 140' in a thickness direction thereof. The hole 141 is provided as a plurality of holes. In addition, the plurality of holes 141 are uniformly arranged, for example, to form a grid. The hole 141 provided in the protective layer 140' allows gas that is generated by a process such as plating to be smoothly discharged, thus reducing an occurrence of blisters, or the like.

Referring to FIG. 9, other components included in the fan-out semiconductor package 100 will be described. First, the encapsulant 150 protects the electronic component 130 and fills a portion of the through hole C provided in the interconnection member 120 to encapsulate the electronic component 130. In this case, the encapsulant 150 covers the interconnection member 120 and the electronic component 130. The encapsulant 150 may be a thermosetting resin such as an epoxy resin, a thermoplastic resin such as a polyimide, or a resin, impregnated with a stiffener such as a glass fiber or an inorganic filler, such as a PPG, an ABF, a FR-4 resin, a bismaleimide triazine (BT) resin, a PID, or the like. In addition, the encapsulant 150 may be obtained using a method of laminating a resin film that is not cured on the redistribution layer 110 and the interconnection member 120. Except for such a method, a molding method, such as EMC, or the like, known in the art is used.

The encapsulant 150 may include conductive particles to block electromagnetic waves, if necessary. For example, the conductive particles are any material that blocks electromagnetic waves, including copper (Cu), aluminum (Al), silver (Ag), tin (Sn), gold (Au), nickel (Ni), lead (Pb), a solder, or the like.

Based on FIG. 9, the redistribution layer 110 includes an external layer 160 and a connection terminal 170 provided therebelow. The external layer 160 serves to protect the redistribution layer 110, from a physical effect, a chemical effect, or the like, and has an opening portion exposing a portion of the conductive pattern 112. The material of the external layer 160 is not particularly limited, and is, for example, a solder resist. In addition, the material of the external layer 160 may also be the same material as that of the insulating layer 111. The external layer 160 is generally a single layer, but could also be formed of multiple layers, if necessary.

The connection terminal 170 is configured to physically or electrically connect the fan-out semiconductor package 100 to an external source of power. For example, the fan-out semiconductor package 100 may be mounted on a main board of an electronic device through the connection terminal 170. The connection terminal 170 may be formed of a conductive material, such as, copper (Cu), aluminum (Al), silver (Ag), tin (Sn), gold (Au), nickel (Ni), lead (Pb), a solder, or the like; however, the conductive material is not particularly limited thereto. The connection terminal 170 may be a land, ball, and/or pin connection type, or the like. The connection terminal 170 is formed of a single layer or multiple layers. When the connection terminal 170 is formed of multiple layers, the connection terminal 170 may include a copper (Cu) pillar and a solder. When the connection terminal 170 is formed of a single layer, the connection terminal 170 may include a tin (Sn)-silver (Ag) solder or copper (Cu). However, this is only an example, and the material of the connection terminal 170 is not limited thereto.

Meanwhile, a portion of connection terminals 170 is disposed in a fan-out region. The fan-out region defines a region except for a region in which an electronic component is disposed. For example, the fan-out semiconductor package 100 according to an embodiment is a fan-out package. The fan-out package has excellent reliability as compared to a fan-in package, implements a plurality of input/output (I/O) terminals, and facilitates a 3D interconnection. In addition, as compared to a ball grid array (BGA) package, a land grid array (LGA) package, or the like, the fan-out package is mounted on an electronic device without a separate board. Thus, the fan-out package is manufactured to have reduced thickness and a lower manufacturing cost.

A method of manufacturing a fan-out semiconductor package having the above-mentioned structure of the present disclosure will hereinafter be described. A description of the method of manufacturing a fan-out semiconductor package allows a package structure according to the above-mentioned embodiment or modification to be understood more clearly.

FIGS. 13, 14, 15, and 16 are schematic cross-sectional views illustrating a method of manufacturing a fan-out semiconductor package according to an embodiment of the present disclosure, respectively.

Figure 13:
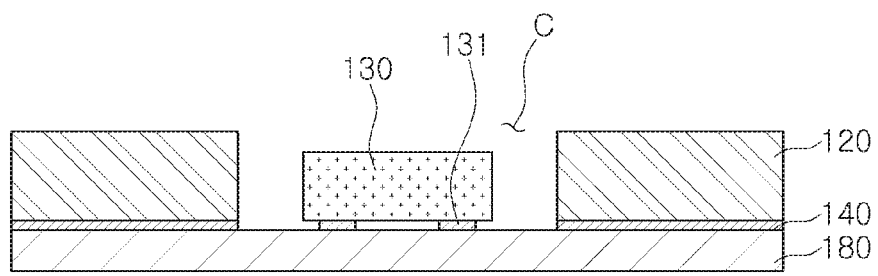
FIGS. 13, 14, 15, and 16 are schematic cross-sectional views illustrating a method of manufacturing a fan-out semiconductor package according to an embodiment, respectively.

First, as illustrated in FIG. 13, an interconnection member 120 having a through hole C is disposed on a support 180, and an electronic component 130 is disposed in the through hole C. In this case, a protective layer 140 is formed on a surface of an interconnection member 120 facing the support 180, for example, a lower surface of the interconnection member 120, based on FIG. 13. The support 180 is provided to dispose the electronic component 130 in the through hole C prior to formation of a redistribution layer 110. The support 180 is a carrier tape, or the like, that performs such disposition function. The support 180 allows an electrode pad 131 of the electronic component 130 and a protective layer 140 to be positioned on the same level. In one example, the interconnection member 120 and the protective layer 140 are obtained using a copper clad laminate (CCL) having a copper (Cu) layer formed on a surface thereof. The protective layer 140 is also formed on all of upper and lower surfaces of the interconnection member 120. In addition, the through hole C formed in the interconnection member 120 is obtained using a laser machining process or a sand blasting process. In this case, the interconnection member 120 has a mask pattern formed thereon to expose a region of the interconnection member 120 corresponding to that of the through hole C.

Figure 14:
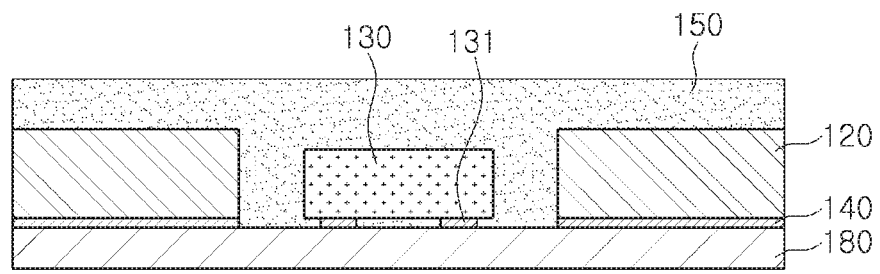

Sequentially, as illustrated in FIG. 14, an encapsulant 150 is formed to fill the through hole C to cover the electronic component 130. The encapsulant 150 may be formed using a process of stacking a sheet such as a PPG, an ABF, or through a molding process.

Figure 15:
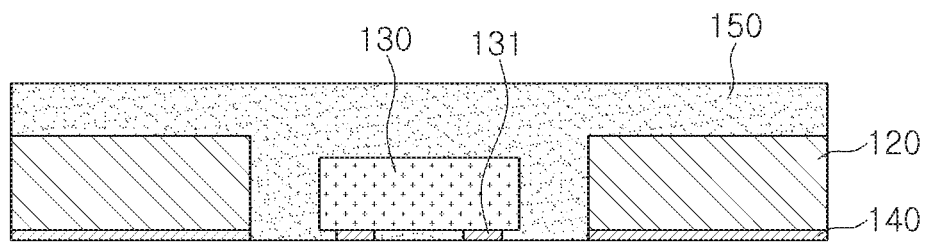
Figure 16:
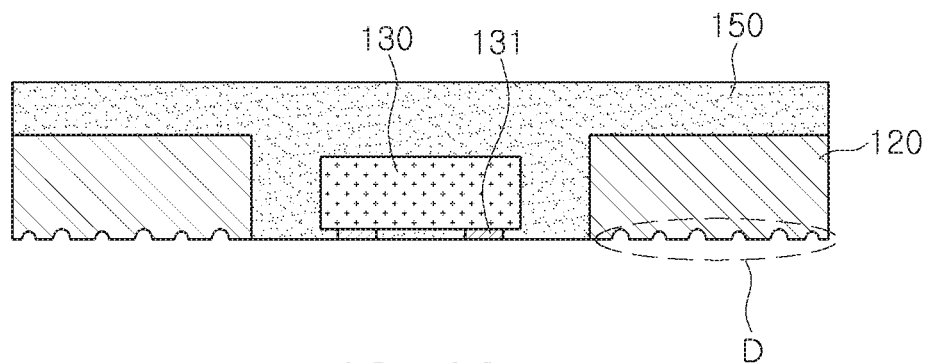

Sequentially, as illustrated in FIG. 15, the support 180 is removed from the interconnection member 120. As illustrated in a comparative example of FIG. 16 (a case in which a protective layer is removed), when the support 180, such as a carrier tape, is separated from the interconnection member 120, surface damage such as a dimple D occurs in the interconnection member 120. This reduces structural stability and reliability of the fan-out semiconductor package and lowers production yield. In view of such an issue, according to the embodiments of FIGS. 13 through 15, the protective layer 140 prevents surface of the interconnection member 120 from being damaged.

Sequentially, the redistribution layer 110 is formed in a region from which the support 180 is removed to implement a fan-out semiconductor package 100 having the structure illustrated in FIG. 9. To form the redistribution layer 110, an insulating layer 111, a conductive pattern 112, and a conductive via 113 is formed to desired shapes, and this formation process is repeated a required number of times. In more detail, a method of forming the insulating layer 111 may be a method known in the art. For example, the insulating layer 111 may be formed using a method of laminating and curing an insulating layer, a method of applying and curing an insulating layer, or the like. A laminating method may be, for example, a method of hot pressing an insulating layer, cooling the hot pressed insulating layer by a cold press, and separating a tool from the cooled insulating layer, or the like. The hot pressing includes pressurizing the insulating layer at high temperatures for a certain period of time, depressurizing the pressurized insulating layer, and cooling the depressurized insulating layer to room temperature. The application method may be, for example, a screen printing method of applying ink with a squeegee, a spray printing method of misting and applying ink, or the like. The curing method may be a method of drying an insulating layer not to be fully cured to use a photolithography method, or the like, as a subsequent process.

Figure 17:
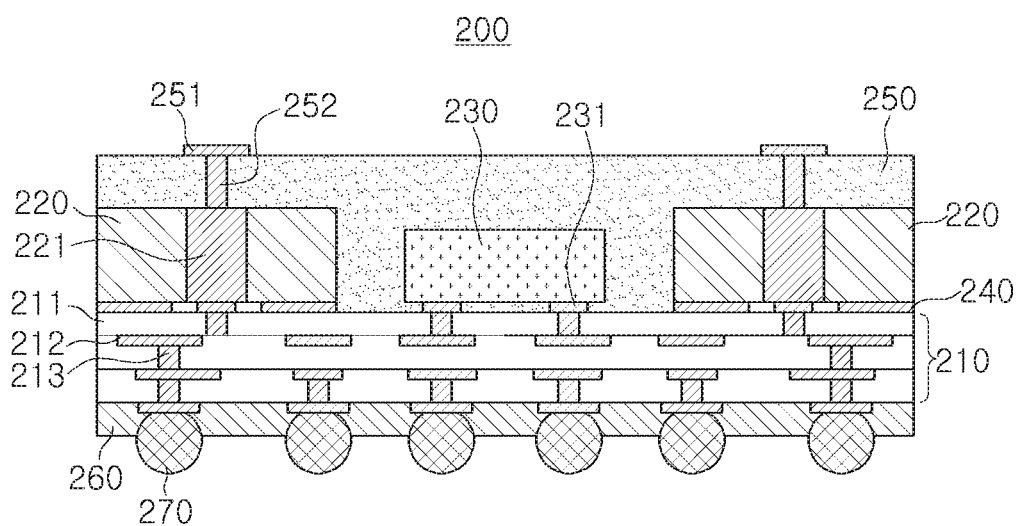
FIG. 17 is a schematic cross-sectional view illustrating a fan-out semiconductor package according to another embodiment.
Figure 18:
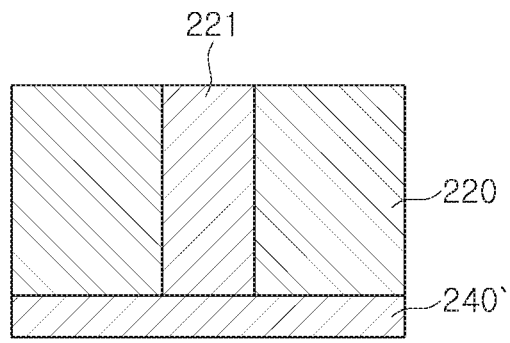
FIG. 18 is a cross-sectional view of a protective layer employable in a modification of the fan-out semiconductor package illustrated in FIG. 17.
Figure 19:
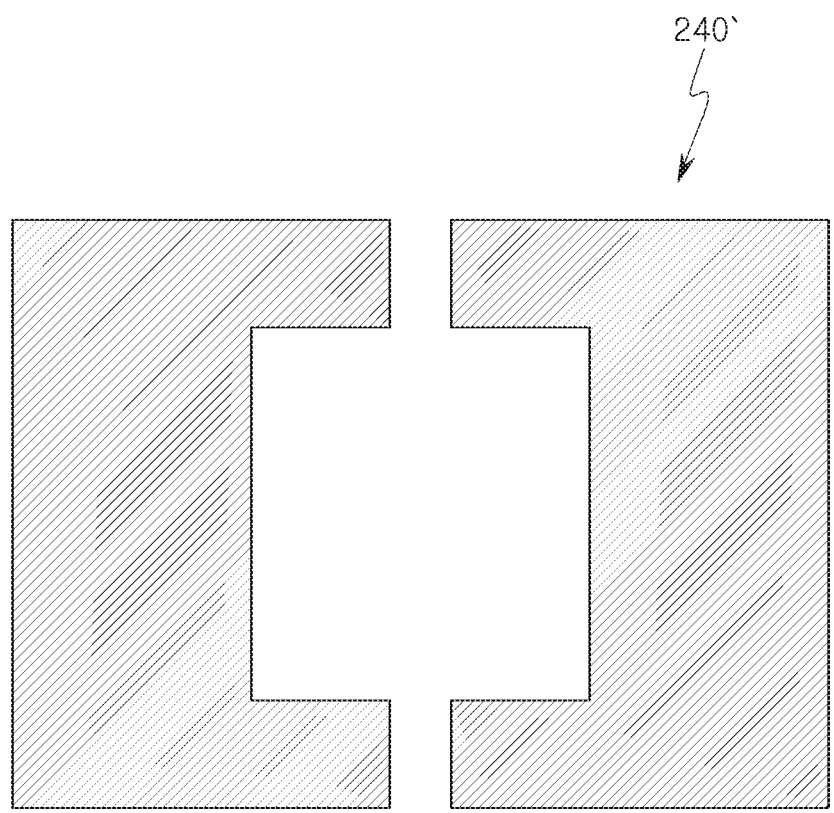
FIG. 19 is a plan view of a protective layer employable in a modification of the fan-out semiconductor package illustrated in FIG. 17.

Referring to FIGS. 17 through 19, a fan-out semiconductor package according to another embodiment of the present disclosure will be described. According to the embodiment of FIG. 17, a fan-out semiconductor package 200 may include a redistribution layer 210 having an insulating layer 211, a conductive pattern 212, and a conductive via 213, an interconnection member 220, an electronic component 230 having an electrode pad 231, a protective layer 240, an encapsulant 250, an external layer 260, and a connection terminal 270. A conductive via 221 that is electrically connected to the redistribution layer 210 is provided in the interconnection member 220. The conductive via 221 of the interconnection member 220 electrically connects upper and lower portions of the fan-out semiconductor package 200 to each other. Thus, an additional electronic component, an additional passive device, or the like, may be disposed on an upper portion of the encapsulant 250, so that a package on package structure may be implemented. In this case, for such an electrical connection, the encapsulant 250 may include a conductive pattern 251 formed on the upper portion thereof and a conductive via 252 electrically connected to the redistribution layer 210.

Meanwhile, as illustrated in FIG. 17, the protective layer 240 including a metallic material, or the like, does not contact the conductive via 221 included in the interconnection member 220. In this case, the protective layer 240 is electrically insulated from the electronic component 230.

Conversely, as illustrated in FIGS. 18 and 19, a protective layer 240' having a modified structure contacts the conductive via 221 included in the interconnection member 220. As illustrated in FIG. 19, the protective layer 240' is divided into a plurality of regions (two regions illustrated in the embodiment of FIG. 19) to be electrically insulated from the electronic component 230. The respective regions are connected to different conductive vias 221. According to the embodiments of FIGS. 18 and 19, the protective layer 240' is electrically connected to the electronic component 230 to serve as a wiring, or the like.

As set forth above, according to the embodiments, a fan-out semiconductor package may improve structural stability and reliability, and may significantly reduce percent defective in a process of manufacturing the fan-out semiconductor package.

A term "example" used in the present disclosure does not mean the same exemplary embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise.

As a non-exhaustive example only, electronic device 1000 as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent after an understanding of the disclosure of this application that the computing system or computer may further include an application chipset, a camera image processor, a mobile Dynamic Random Access Memory (DRAM), or any other component suitable for inclusion in a computing system or computer. The memory controller and the flash memory device may constitute a solid-state drive or disk (SSD) that uses non-volatile memory to store data.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A fan-out semiconductor package, comprising:
an insulating layer and conductive patterns disposed on a first side of the insulating layer;
a frame having a through hole and disposed on a second side of the insulating layer opposing the first side;
a metal layer having a hole, and having upper and lower surfaces being in physical contact with a lower surface of the frame and the second side of the insulating layer, respectively;
a semiconductor chip having first and second surfaces opposing each other, including electrode pads disposed on the first surface and facing the second side of the insulating layer, and disposed on a portion of the insulating layer and within the through hole of the frame and the hole of the metal layer, the electrode pads being electrically connected to the conductive patterns through vias penetrating through the insulating layer; and
an encapsulant extending continuously to cover an upper surface of the frame and the second surface of the semiconductor chip, to fill at least a portion of the through hole, and to cover a side surface of the metal layer connecting the upper and lower surfaces of the metal layer,
wherein the metal layer is electrically insulated from the semiconductor chip.

2. The fan-out semiconductor package of claim 1, wherein the metal layer is conterminous with the lower surface of the frame.

3. The fan-out semiconductor package of claim 1, wherein the metal layer has a width narrower than a width of the frame.

4. The fan-out semiconductor package of claim 1, wherein lower surfaces of the electrode pads and the lower surface of the metal layer are positioned on the same level.

5. The fan-out semiconductor package of claim 1, wherein the metal layer comprises a plurality of holes formed therein.

6. The fan-out semiconductor package of claim 5, wherein the plurality of holes form a grid.

7. The fan-out semiconductor package of claim 1, wherein the frame comprises a conductive via passing through the frame to be electrically connected to one of the conductive patterns.

8. The fan-out semiconductor package of claim 7, further comprising another metal layer spaced apart from the metal layer, surrounded by the metal layer, and disposed on the same level as the metal layer,
wherein the conductive via is electrically connected to the one of the conductive patterns through the another metal layer.

9. The fan-out semiconductor package of claim 1, wherein the metal layer has a plurality of regions space apart from each other.

10. The fan-out semiconductor package of claim 1, further comprising a conductive via passing through the encapsulant to be electrically connected to one of the conductive patterns.

11. A fan-out semiconductor package comprising:
a redistribution layer;
a frame having a through hole, the frame disposed on the redistribution layer;
a metal layer disposed between the redistribution layer and the frame, having a hole, and coupled to the frame to protect the frame; and
a semiconductor chip disposed on a portion of the redistribution layer within the through hole of the frame and the hole of the metal layer, and electrically connected to the redistribution layer,
wherein the metal layer is electrically insulated from the semiconductor chip,
the metal layer is attached to a lower surface of the frame defining a frame, and has a shape corresponding to a shape of the lower surface of the frame, and
the metal layer is disposed on the lower surface of the frame, and no metal layer is disposed on an upper surface of the frame opposing the lower surface.

12. A fan-out semiconductor package, comprising:
a lower layer comprising connection terminals;
an upper layer comprising an encapsulant, a frame disposed on a metal layer and having a lower surface facing the metal layer, and a semiconductor chip disposed in a through hole of the frame and having electrode pads facing the lower layer and disposed on a lower surface of the semiconductor chip; and a middle layer defining a redistribution layer disposed contiguously between the upper layer and the lower layer, wherein the metal layer is electrically insulated from the semiconductor chip, and the encapsulant extends continuously to cover an upper surface of the semiconductor chip opposing the lower surface of the semiconductor chip and an upper surface of the frame opposing the lower surface of the frame, to fill a portion of the through hole, and to cover a side surface of the metal layer.

13. The fan-out semiconductor package of claim 12, further comprising a conductive via penetrating through the encapsulant and the frame to electrically connect to the middle layer.

14. The fan-out semiconductor package of claim 12, wherein the fan-out semiconductor package is a fan-out wafer level package (WLP).

15. An electronic device, comprising the fan-out semiconductor package of claim 12.

\* \* \* \* \*